United States Patent [19]
Berthold et al.

[11] Patent Number: 5,371,423
[45] Date of Patent: Dec. 6, 1994

[54] TRI-STATE-CAPABLE DRIVER CIRCUIT

[75] Inventors: Joerg Berthold, Munich; Gerhard Nebel, Immenstadt; Doris Schmitt-Landsiedel, Ottobrunn, all of Germany

[73] Assignee: Siemens Aktiengesellschaft, Munich, Germany

[21] Appl. No.: 107,960

[22] Filed: Aug. 17, 1993

[30] Foreign Application Priority Data

Dec. 14, 1992 [DE] Germany ............... 4242152

[51] Int. Cl.⁵ .................................... H03K 19/02
[52] U.S. Cl. .......................... 326/57; 326/84; 326/110
[58] Field of Search ............ 307/473, 446, 570, 443

[56] References Cited

U.S. PATENT DOCUMENTS

| 4,703,203 | 10/1987 | Gallup et al. | 307/473 |
| 4,725,982 | 2/1988 | Hara et al. | 307/473 |
| 4,746,817 | 5/1988 | Banker | 307/446 |
| 5,001,365 | 3/1991 | Murabayashi | 307/443 |
| 5,083,048 | 1/1992 | Kashimura | 307/473 |

Primary Examiner—Edward P. Westin
Assistant Examiner—Andrew Sanders
Attorney, Agent, or Firm—Hill, Steadman & Simpson

[57] ABSTRACT

A tri-state capable driver circuit or totem pole circuit is formed in BiCMOS technology and includes a selection circuit, first and second drive circuits, and first and second bipolar transistors. A short circuit unit is connected between the base and the emitter of the first bipolar transistor to prevent excessively high inhibit voltages across the base-emitter junction of the first bipolar transistor. The operation of the short circuit unit depends upon signals received at the tri-state activation input.

9 Claims, 2 Drawing Sheets

TRI-STATE-CAPABLE DRIVER CIRCUIT

BACKGROUND OF THE INVENTION

1. Field of the Invention

The present invention is related generally to a tri-state-capable drive circuit and, in particular, to a driver circuit having a selection circuit connected to a signal input and to a tri-state activation input, the output of the selection circuit being connected to first and second drive circuits, the drive circuits being connected to first and second bipolar transistors.

2. Description of the Related Art

U.S. Pat. No. 4,725,982 discloses a tri-state-buffer circuit which includes a switching circuit, or selection circuit, having first and second drive circuits and an output unit having first and second bipolar transistors at the driver output. The tri-state buffer circuit requires only a small chip area and yet is capable of driving a great capacity of loads at high operating speed.

SUMMARY OF THE INVENTION

It is an object of the present invention to provide a tri-state-capable driver circuit wherein a base-emitter path of the bipolar transistor at the driver output does not receive, for example, the full supply voltage. Instead, only a significantly lower voltage is applied in the nonconducting direction across the base-emitter junction of the bipolar transistor at the driver output. As a result, possible destruction of the bipolar transistor is prevented.

This and other objects and advantages of the invention are achieved by a tri-state driver circuit having a selection circuit with two outputs, a first drive circuit connected to both of the outputs of the selection circuit, the first drive circuit generating a high impedance output when a logical "1" is applied at the first input of the first drive circuit and a logical "0" is simultaneously applied to the second input of the first drive circuit. When either a logical "0" or a logical "1" are applied simultaneously to both inputs of the first drive circuit, then the output of the first drive circuit carries a signal that is non-inverted in comparison to the signal at the input of the selection circuit. A first bipolar transistor is connected to the output of the first drive circuit and a short circuit means is connected to short circuit the base and emitter of the first bipolar transistor when a logical "1" is applied to a tri-state activation input. The short circuit means separates, i.e. opens the short circuit connection between, the base and emitter of the first bipolar transistor when a logical "0" is applied to the tri-state activation input. The tri-state driver also includes a second drive circuit connected to the second output of the selection circuit and driving a second bipolar transistor which drives the output of the driver circuit.

An advantage which is obtained by the measures of the present invention is that only an insignificantly larger chip area is required for the present tri-state driver circuit in comparison to the chip area required for the known tri-state driver circuit and, further, no additional capacitive loading of the driver output is effected by the circuit of the present invention.

According to a preferred development of the tri-state-capable driver circuit of the invention, the short circuit means preferably comprises a transfer gate having a first n-channel MOS transistor and a first p-channel MOS transistor with the first terminals of the MOS transistors connected to the base of the first bipolar transistor and the second terminals of the two MOS transistors connected to the emitter of the first bipolar transistor. Preferably, the gate terminal of the n-channel MOS transistor is connected to the tri-state activation input and the gate terminal of the p-channel MOS transistor is connected to the inverted tri-state activation input.

In an alternate embodiment, the short circuit means may be composed only of an n-channel MOS transistor having one terminal connected to the base and the other terminal connected to the emitter of the first bipolar transistor and the gate terminal thereof connected to the tri-state activation input. Alternately, the short circuit means may be composed only of a p-channel MOS transistor having one terminal connected to the base and the other terminal connected to the emitter of the first bipolar transistor and the gate terminal connected to the inverted tri-state activation input.

Preferred embodiments include a first drive circuit composed of a second p-channel MOS transistor and a second n-channel MOS transistor with the gate of the second p-channel MOS transistor connected to the first input of the first drive circuit and the gate of the second n-channel MOS transistor connected to the second input of the first drive circuit. One terminal of the second p-channel MOS transistor is connected to the supply voltage while one terminal of the second n-channel MOS transistor is connected to a reference potential. The other terminal of the p-channel MOS transistor and the other terminal of the n-channel MOS transistor are connected together and the junction thereof forms the output of the first drive circuit.

A preferred embodiment of the second drive circuit includes a third, fourth, and fifth n-channel MOS transistors in which the gate terminal of the third n-channel MOS transistor is connected to the second output of the selection circuit, the gate terminal of the fourth n-channel MOS transistor is connected the tri-state activation input, and the gate terminal of the fifth n-channel MOS transistor is connected to the output of the first drive circuit. A first terminal of the third n-channel MOS transistor is connected to the output of the driver circuit and the other terminal of the third n-channel MOS transistor is connected to the output of the second drive circuit. One terminal of each of the fourth and fifth n-channel MOS transistors are connected to the output of the second drive circuit and the other terminals of the fourth and fifth n-channel MOS transistors are connected to the reference potential.

A variation of the present invention provides that the second drive circuit includes a third and a fourth n-channel MOS transistor as well as a resistor. The gate terminal of the third n-channel MOS transistor is connected to the second output of the selection circuit and the gate terminal of the fourth n-channel MOS transistor is connected to the tri-state activation input. One terminal of the third n-channel MOS transistor is connected to the output of the driver circuit and the other terminal thereof is connected to the output of the second drive circuit. One terminal of the fourth n-channel MOS transistor and the resistor are both connected to the output of the second drive circuit while the other terminal of the fourth n-channel transistor and the resistor are connected to a reference potential.

An additional feature of the present invention provides that a resistor may also be connected between the base and the emitter of the first bipolar transistor. This resistor may be in the form of an MOS transistor having one terminal connected to the base of the first bipolar transistor and both the second terminal and the gate terminal connected to the emitter of the first bipolar transistor.

BRIEF DESCRIPTION OF THE DRAWINGS

The invention shall be set forth in greater detail below with reference to the drawings.

DETAILED DESCRIPTION OF THE PREFERRED EMBODIMENTS

Figure 1:
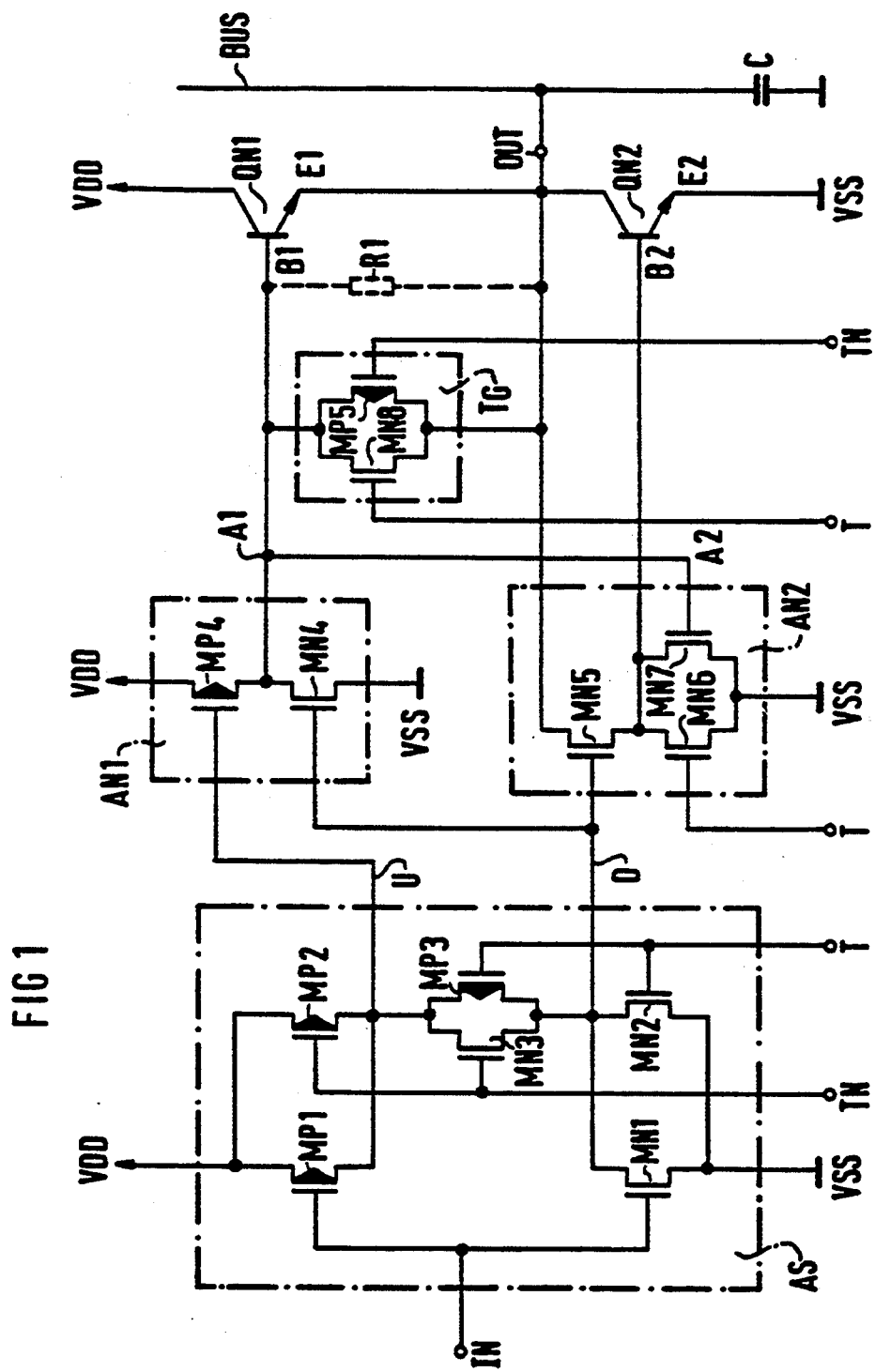
FIG. 1 is a circuit diagram of a driver circuit according to the principles of the present invention, including an optional resistor shown in dotted outline.

In FIG. 1 is shown a tri-state-capable driver circuit, or buffer circuit, having a selection circuit AS, a first drive circuit AN1, a second drive circuit AN2, a first bipolar transistor QN1, a second bipolar transistor QN2 and a short circuit means TG. The selection circuit AS has an input which is also the input IN of the driver circuit of the invention. The selection circuit AS also has a tri-state activation input T, and an inverted tri-state activation input TN which carries a signal that is the inverse of the signal at the tri-state input T. The selection circuit AS is connected to a supply voltage via terminal VDD and to a reference potential via terminal VSS. The selection circuit AS has two outputs, a first output U and a second output D.

The first drive circuit AM1 has a first input that is connected to the first output U of the selection unit AS, and has a second input that is connected to the second output D of the selection unit AS. The first drive circuit AN1 is also connected to the supply voltage via the terminal VDD and to the reference potential the terminal VSS. The drive circuit AN1 has an output A1.

The second drive circuit AN2 also has two inputs, the first input being connected to the second output D of the selection circuit AS and the second input being connected to the tri-state activation input T of the driver circuit. The second drive circuit AN2 is also connected to an output OUT of the overall driver circuit as well as to the reference potential terminal VSS. The second drive circuit AN2 has an output A2.

The first bipolar transistor QN1 has a base which is driven by the signal from the output A2 of the first drive circuit AN1, while the base B2 of the second bipolar transistor QN2 is driven by the signal from the output A2 of the second drive circuit AN2. The collector terminal of the first bipolar transistor QN1 is supplied to the supply voltage to the terminal VDD and the collector of the second bipolar transistor QN2 is connected to the output OUT of the overall driver circuit. An emitter E1 of the first bipolar transistor QN1 is also connected to the output OUT of the overall driver circuit, while an emitter E2 of the second bipolar transistor QN2 is connected to the reference potential terminal VSS.

The output OUT of the overall driver circuit is connected to a bus BUS for the chip. The bus BUS has a capacitance C relative to the reference potential terminal VSS.

The circuit of the present invention also includes a short circuit means TG which is driven by the signal on the tri-state activation input T and by the inverse of the tri-state activation input TN. The short circuit means is connected between the base B1 and the emitter E1 of the first bipolar transistor QN1.

An optional feature of the present invention provides a resistor R1 connected between the base B1 and the emitter E1 of the first bipolar transistor QN1. The optional resistor R1 is indicated in broken outline in FIG. 1.

Operationally, the elements of the present driver circuit function as follows:

The selection circuit AS transmits a logical 1 at its first output U and a logical "0" at its second output D when a logical "1" is applied to the tri-state activation input T, so that the tri-state condition of the driver circuit is activated. When a logical "0" is applied to the tri-state activation input, the selection circuit AS acts as an inverter circuit. Accordingly, a signal applied at the input IN of the driver circuit appears in inverted form at both the first and second outputs U and D. In the illustrated embodiment, the selection circuit AS, for example, is made up of three n-channel MOS transistors MM1, MM2 and MM3 and by three p-channel MOS transistors MP1, MP2 and MP3, which corresponds generally to the switching circuit of U.S. Pat. No. 4,725,982 described above.

The first drive circuit AN1 includes a p-channel MOS transistor MP4 and an n-channel MOS transistor MN4. The gate of the p-channel MOS transistor MP4 is connected to the first input of the drive circuit while the gate of the n-channel MOS transistor MN4 is connected to the second input of the first drive circuit AN1. One terminal of the p-channel transistor MP4 is connected to the supply voltage terminal VDD, while the first terminal of the n-channel transistor MN4 is connected to the reference voltage terminal VSS. The second terminals of the MOS transistors MP4 and MN4 are connected together to form a junction which serves as the output A1 of the first drive circuit AN1.

The second drive circuit AN2 has, for example, three n-channel MOS transistors MN5, MN6 and MN7, which are connected in a configuration similar to that disclosed in U.S. Pat. No. 4,725,982. In particular, the second output B of the selection circuit AS is connected to the base of the n-channel resistor MN5 while a first terminal of the n-channel transistor MN5 is connected to the output OUT of the overall driver circuit and the other terminal thereof is connected to the first terminals of both n-channel MOS transistors MN6 and MN7. The other terminals of the n-channel transistors MN6 and MN7 are connected to the reference voltage terminal VSS. The gate of the transistor MN6 is connected to the tri-state activation input T, while the gate of the n-channel transistor MN7 is connected to the output A1 of the first drive circuit AN1.

Figure 2:
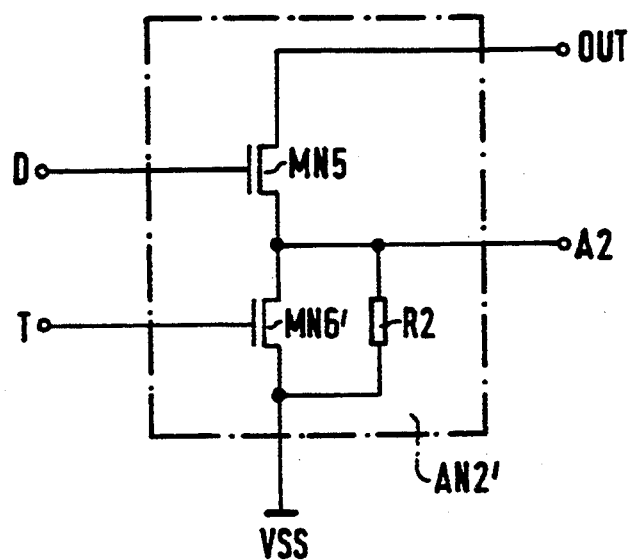
FIG. 2 is an alternate embodiment of a drive circuit which constitutes part of the circuitry of FIG. 1.

An alternate arrangement for the second drive circuit AN2' is shown in FIG. 2 having a first n-channel MOS transistor MN5' and a second n-channel MOS transistor MN6' as well as a resistor R2. The gate of the first n-channel and the last transistor MN5 is connected to the second output D of the selection circuit AS and the gate of the second n-channel MOS transistor MN6' is connected to the tri-state activation input T. One terminal of the first transistor MN5', one terminal of the second MOS transistor MN6', and one terminal of the resistor R2 are connected to the output A2 of the second drive unit AN2'. The other terminal of the resistor R2 and the second MOS transistor MN6' is connected to the reference voltage terminal VSS, while the second terminal of the first MOS transistor MN5' is connected to the output OUT of the driver circuit.

Referring once again to FIG. 1, the short circuit means TG is a transfer gate having an n-channel MOS transistor MN8 and a p-channel MOS transistor MP5 connected in parallel with one another, wherein the gate of the n-channel MOS transistor MN8 is driven by the signal from the tri-state activation input T and the gate of the p-channel MOS transistor MP5 is driven by a signal from the inverse tri-state activation input TN. The short circuit means TG is connected across the base-emitter terminal of the first bipolar transistor QN1.

In an alternate embodiment, the short circuit means TG is composed only of one of the MOS transistors, either transistor MP5 or transistor MN8, which are connected with the terminals between the base-emitter junction of the first bipolar transistor. This limits the maximum inhibit voltage to approximate 0.7 volts between the base and emitter of the first bipolar transistor.

The resistor R1 is provided as an option in the circuit of FIG. 1 and serves to keep the inhibit voltage in the active condition of the driver circuit, for example, when the tri-state activation input T is zero, as low as possible. This is true since the base B1 of the first bipolar transistor is discharged considerably faster than the emitter E1 when no resistor R1 is present, which can lead to an unacceptably high voltage which stresses the base-emitter junction. The resistor R1 can either be a resistor component or can be an MOS transistor which has its first terminal connected to the base B1 and its second terminal as well as its gate terminal connected to the emitter E1 to provide a resistance.

A comparison between the known circuit as represented by U.S Pat. No 4,725,982 and the circuit of the invention follows: If, as in a known circuit, the first drive circuit AN1 were operating as an inverter and the first and second inputs of the first drive circuit AN1 are both driven by the first output signal U of the selection circuit AS, and if the short circuit means TG were not present, then when the output A1 of the first drive circuit is a logical "0" and the first bipolar transistor QN1 inhibits, the base-emitter junction between the base B1 and the emitter E1 would carry an inhibit voltage which corresponds to the voltage on the bus BUS which can, at its maximum, assume the value of the supply voltage VDD. The critical situation occurs when both bipolar transistors QN1 and QN2 are in the inhibit state. The output OUT is then in a high impedance state (tri-state) and the bus BUS is charged with the voltage which roughly corresponds to the supply voltage by the further driver circuits connected to the bus. By contrast, the driver circuit according to the present invention permits only slight inhibit voltages of, for example, 500 mV across the base-emitter junction of the first bipolar transistor. When, in the driver circuit of the invention, a logical "1" is applied to the tri-state activation input T, then a logical "1" is found at the first input of the first drive circuit AN1 and a logical "0" is at the second input of the logical drive circuit AN1. As a result, the output of the first drive circuit AN1 is switched to a high impedance state. The output A1 of the first drive circuit AN1 is not shorted by the short circuit means TG since the short circuit means TG connects the base-emitter terminals only when the tri-state activation input T carries a logical "1". The first bipolar transistor QN1 is in an inhibit state since the voltage between its base B1 and emitter E1 is approximately 0 volts and the bipolar transistor QN2 is in an inhibit state since the base V2 is at the reference potential VSS of the emitter E2 as a result of the n-channel MOS transistor MN6, or MN6', which is driven by the signal of the tri-state activation input T.

When the tri-state activation input is at a logical "0", in other words, when the driver is active, the first drive circuit AN1 acts as an inverting amplifier and the second drive circuit acts as a non-inverting amplifier and, as a result, the base B1 of the first bipolar transistor QN1 receives a signal which corresponds to the non-inverted, amplified signal received at the input IN of the driver circuit. The base B2 of the second bipolar transistor QN2 receives a signal which corresponds to the inverter, amplified signal at the input IN of the driver circuit. When a logical "1" is applied at the input IN, then the first bipolar transistor QN1 is transmissive and the second bipolar transistor QN2 inhibits; correspondingly, the first bipolar transistor QN1 inhibits and the second bipolar transistor QN2 becomes transmissive as soon as the signal at the input IN corresponds to a logical "0".

Thus, in the active condition, the driver circuit of the invention functions as a non-inverting driver circuit.

Modern BiCMOS technology achieves a high switching speed due to, among other things, an optimized doping distribution in the base and the emitter. Increasingly shallow doping profiles with correspondingly greater doping ingredients are, thus, employed. There is then a maximally allowable inhibit voltage for the base-emitter junction of transistors having such doping profiles so that the inhibit voltage potentially must lie below the value of the supply voltage. The driver circuit of the present invention prevents the application of unacceptably high inhibit voltages, the driver circuit can, for example, be employed in high speed applications with supply voltages of three volts or more. In this context, high speed applications typically refer to gate running times of 1 ns given loads of 1 pF.

Thus, there is shown and described a tri-state driver circuit or totem pole circuit in BiCMOS technology having a selection circuit, first and second drive circuits, and first and second bipolar transistors in which the inhibit voltage is prevented from becoming too high for the first bipolar transistor. This is achieved through the use of a short circuit means connected between the base and the emitter of the bipolar transistor wherein the short circuit means temporarily shorts the base-emitter junction depending upon a signal from the tri-state activation input.

Although other modifications and changes may be suggested by those skilled in the art, it is the intention of the inventors to embody within the patent warranted hereon all changes and modifications as reasonably and properly come within the scope of their contribution to the art.

We claim:

1. A tri-state-capable driver circuit for connection to a supply voltage terminal and a reference potential terminal and a tri-state-activation input and to an input, comprising:

a selection circuit connected to said supply voltage terminal and to said reference potential terminal and to said tri-state-activation input, said selection circuit having first and second outputs whereby said first output of said selection circuit carries a logical 1 and said second output of said selection circuit carries a logical 0 when a logical 1 is applied to said tri-state-activation input and whereby said first and second outputs of said selection circuit carry a signal that is an inverse of a signal at said input of the driver circuit when a logical 0 is applied to said tri-state-activation input;

a first drive circuit connected to said supply voltage terminal and to said reference voltage terminal, said first drive circuit having a first input connected to said first output of the selection circuit, said first drive circuit having a second input connected to said second output of said selection circuit, said first drive circuit having an output at a high-impedance state when a logical 1 is applied to said first input of said first drive circuit and a logical 0 is simultaneously applied to said second input of said first drive circuit, and said output of said first drive circuit carrying a signal that is non-inverted in comparison to a signal at said input of said driver circuit when one of a logical 0 and a logical 1 is simultaneously adjacent at both inputs of said first drive circuit;

a second drive circuit is connected to said supply voltage terminal and to said second output of said selection circuit, said second drive circuit having an output whereby said output of said second drive circuit has a logical 0 when a logical 1 is applied to said tri-state-activation input, and said output of said second drive circuit has a signal that is an inverse of a signal at said input of said driver circuit when a logical 0 is applied to said tri-state-activation input;

a first bipolar transistor of a first type having base that is connected to said output of said first drive circuit and having a collector connected to said supply voltage terminal and having an emitter connected to an output of said driver circuit;

a second bipolar transistor of said first type having a base connected to said output of said second drive circuit and having a collector connected to said output of said driver circuit and having an emitter connected to said reference potential terminal;

a short-circuit means for shorting said base of said first bipolar transistor and said emitter of said first bipolar transistor when a logical 1 is applied to said tri-state-activation unit and for separating said base of said first bipolar transistor from said emitter of said first bipolar transistor when a logical 0 is applied to said tri-state-activation input.

2. A tri-state capable driver circuit as claimed in claim 1, wherein said short circuit means comprises a transfer gate having a first n-channel MOS transistor and first p-channel MOS transistor wherein a first terminal of each of said n-channel and p-channel transistors is connected to said base of said first bipolar transistor and a second terminal of each of said n-channel and p-channel transistors is connected to said emitter of said first bipolar transistor, said first n-channel MOS transistor having a gate terminal connected to said tri-state activation input and said p-channel MOS transistor of said transfer gate having a gate terminal connected to said inverted tri-state activation input.

3. A tri-state capable driver circuit as claimed in claim 1, wherein said short circuit means comprises an n-channel MOS transistor having a first terminal connected to said base of said first bipolar transistor and a second terminal connected to said emitter of said first bipolar transistor, said n-channel MOS transistor having a gate terminal connected to said tri-state activation input.

4. A tri-state capable driver circuit as claimed in claim 1, wherein said short circuit means comprises a p-channel MOS transistor having a first terminal connected to said base of said first bipolar transistor and a second terminal connected to said emitter of said first bipolar transistor, said p-channel MOS transistor having a gate terminal connected to said inverted tri-state activation input.

5. A tri-state capable driver circuit as claimed in claim 1, wherein said first drive circuit comprises a p-channel MOS transistor and an n-channel MOS transistor, said p-channel MOS transistor having a gate connected to said first input of said first drive circuit and said n-channel MOS transistor having a gate connected to said second input of said first drive circuit, said p-channel MOS transistor having a first terminal connected to said supply voltage terminal and said n-channel MOS transistor having a first terminal connected to said reference potential terminal, and said p-channel MOS transistor having a second terminal connected to a second terminal of said n-channel MOS transistor and to said output of said first drive circuit.

6. A tri-state capable driver circuit as claimed in claim 1, wherein said second drive circuit includes three n-channel MOS transistors, a first of said n-channel MOS transistors having a gate terminal connected to said second output of said selection circuit, a second of said n-channel MOS transistors having a gate terminal connected to said tri-state activation input, and a third of said n-channel MOS transistors having a gate terminal connected to said output of said first drive circuit, said first of said n-channel MOS transistors having a first terminal connected to said output of said driver circuit and a second terminal connected to said output of said second drive circuit, said second and third n-channel MOS transistors having a first terminal connected to said output of said second drive circuit and a second terminal connected to said reference potential terminal.

7. A tri-state capable driver circuit as claimed in claim 1, wherein said second drive circuit includes two n-channel MOS transistors and a resistor, said first of said n-channel MOS transistors having a gate terminal connected to said second output of said selection circuit, said second of said n-channel MOS transistors having a gate terminal connected to said tri-state activation input, said first of said n-channel MOS transistors having a first terminal connected to said output of said driver circuit and a second terminal connected to said output of said second drive circuit, and said second n-channel MOS transistor having a first terminal connected to said output of said second drive circuit and a second terminal connected to said reference potential terminal, and said resistor connected across said first and second terminals of said second n-channel MOS transistor.

8. A tri-state capable driver circuit as claimed in claim 1, further comprising:
a resistance having a first terminal connected to said base of said first bipolar transistor and a second terminal connected to said emitter of said first bipolar transistor.

9. A tri-state capable driver circuit as claimed in claim 8, wherein said resistance comprises an MOS transistor having a first terminal connected to said base of said first bipolar transistor and a second terminal and a gate terminal connected to said emitter of said first bipolar transistor.

* * * * *